(12) United States Patent
Lin (10) Patent No.: US 7,147,489 B1
(45) Date of Patent: Dec. 12, 2006

(54) SOCKET HAVING A STRUCTURE FOR GRASPING SOLDER BALLS

(75) Inventor: Louie Lin, Taipei Hsien (TW)

(73) Assignee: Tai Twun Enterprise Co., Ltd., Taipei Hsien (TW)

( * ) Notice: Subject to any disclaimer, the term of this patent is extended or adjusted under 35 U.S.C. 154(b) by 0 days.

(21) Appl. No.: 11/249,857

(22) Filed: Oct. 12, 2005

(51) Int. Cl.
*H01R 12/00* (2006.01)

(52) U.S. Cl. ........................................ 439/83

(58) Field of Classification Search ............ 439/83, 439/876
See application file for complete search history.

(56) References Cited

U.S. PATENT DOCUMENTS

| | | | |
|---|---|---|---|
| 6,056,558 A * | 5/2000 | Lin et al. ............ | 439/83 |
| 6,533,590 B1 * | 3/2003 | Lee et al. ............ | 439/83 |
| 6,570,280 B1 * | 5/2003 | Takahashi ............ | 310/71 |
| 6,572,397 B1 * | 6/2003 | Ju ...................... | 439/342 |
| 6,702,594 B1 * | 3/2004 | Lee et al. ............ | 439/83 |
| 6,755,667 B1 * | 6/2004 | Lin ..................... | 439/83 |
| 6,783,375 B1 * | 8/2004 | He ...................... | 439/83 |
| 6,857,184 B1 * | 2/2005 | Ju ...................... | 29/876 |

* cited by examiner

*Primary Examiner*—Gary F. Paumen
(74) *Attorney, Agent, or Firm*—Pro - Techtor Int'l Services (57) ABSTRACT

A socket having a structure for grasping solder balls is disclosed. A grasping hole is laterally defined in the solder joint of each terminal of the socket, and a stop wall is formed at the dielectric housing spaced from the grasping hole at a proper distance. The solder ball is secured between the stop wall and the solder joint with a portion of the solder ball being received in the grasping hole. The dimension of the grasping hole is slightly larger than that of a side surface of the solder ball received in the grasping hole, whereby the solder ball is freely movable up and down in the grasping hole of the solder joint. Therefore, when the socket is soldered to the circuit board, the solder balls can automatically fully contact the surface of the circuit board.

7 Claims, 10 Drawing Sheets

SOCKET HAVING A STRUCTURE FOR GRASPING SOLDER BALLS

FIELD OF THE INVENTION

The present invention relates to a structure for grasping solder balls, and particularly to a socket having a structure for grasping solder balls that can automatically adjust heights of the solder balls in accordance with flatness or warpage of a surface of a circuit board, whereby all the solder balls can be soldered in full contact with the surface of the circuit board.

BACKGROUND OF THE INVENTION

With developments of electronic circuits, digital processing bits increase in number and digital processing speed becomes faster and faster. Consequently, the number of pins of corresponding sockets must also increase. Thus, sockets having many pins have become more frequent and more important.

A socket is mounted on a circuit board through surface mount technology (SMT), which often involves solder balls being disposed at a solder jointjoint of each terminal of the socket through pre-soldering or planting solder balls. However, this technique often results in open solder joints.

Figure 1:
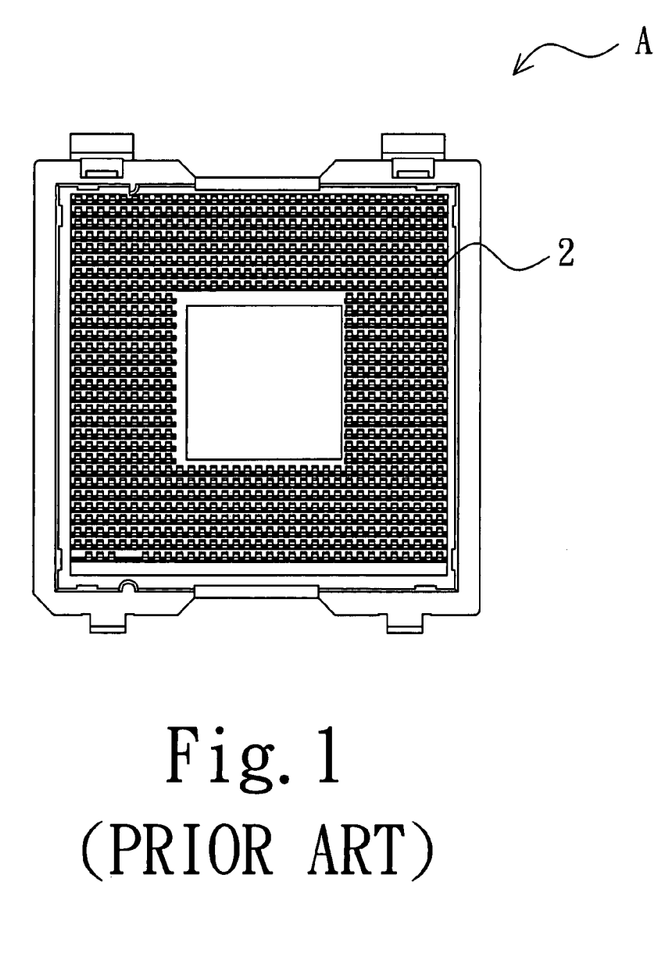
FIG. 1 shows a top plan view of a socket.
Figure 2:
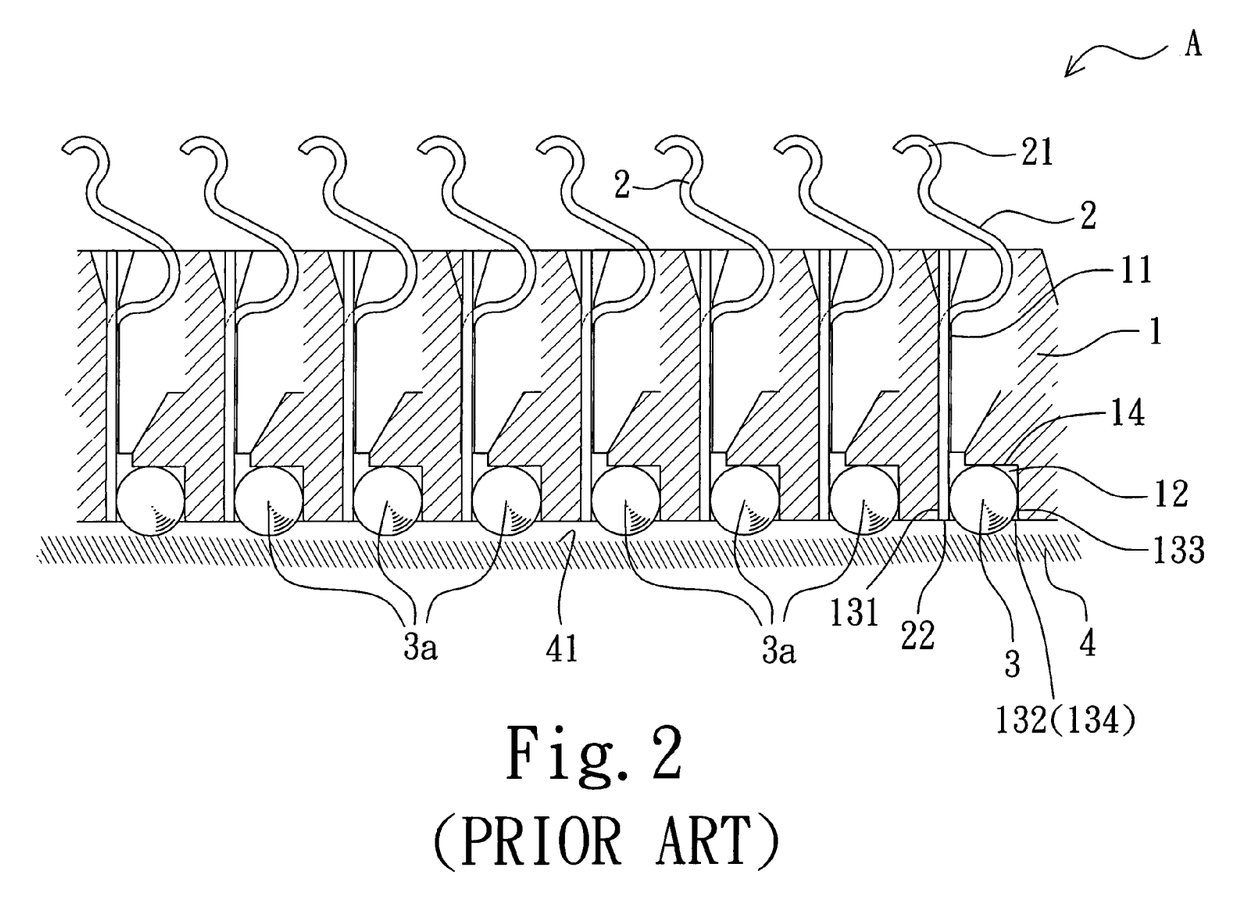
FIG. 2 is a schematic view showing solder balls being planted to terminals of the socket of FIG. 1.
Figure 3:
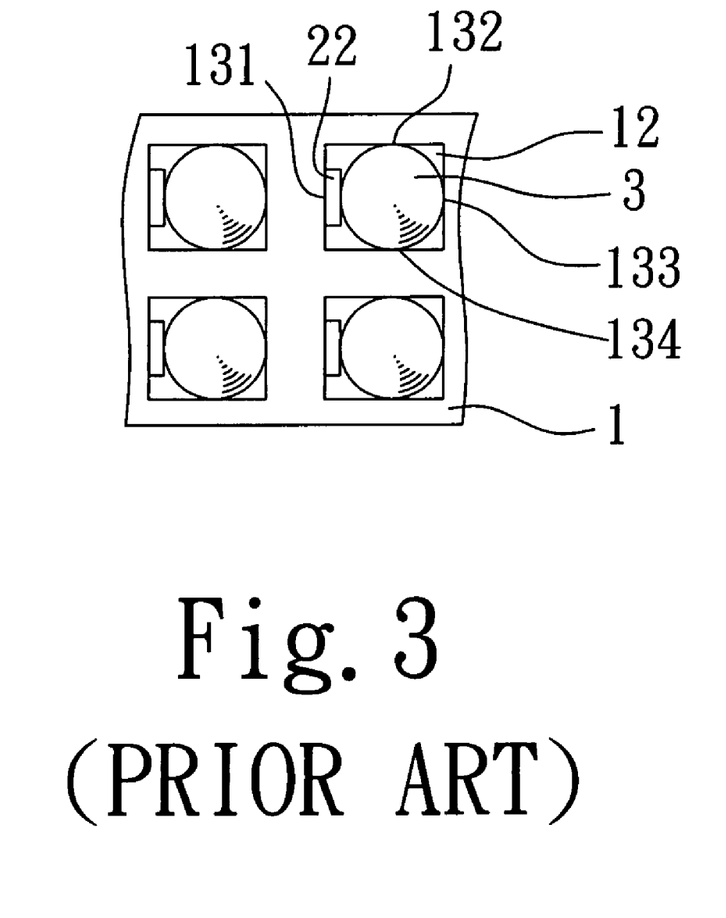
FIG. 3 is a bottom plan view of a part of FIG. 2.
Figure 4:
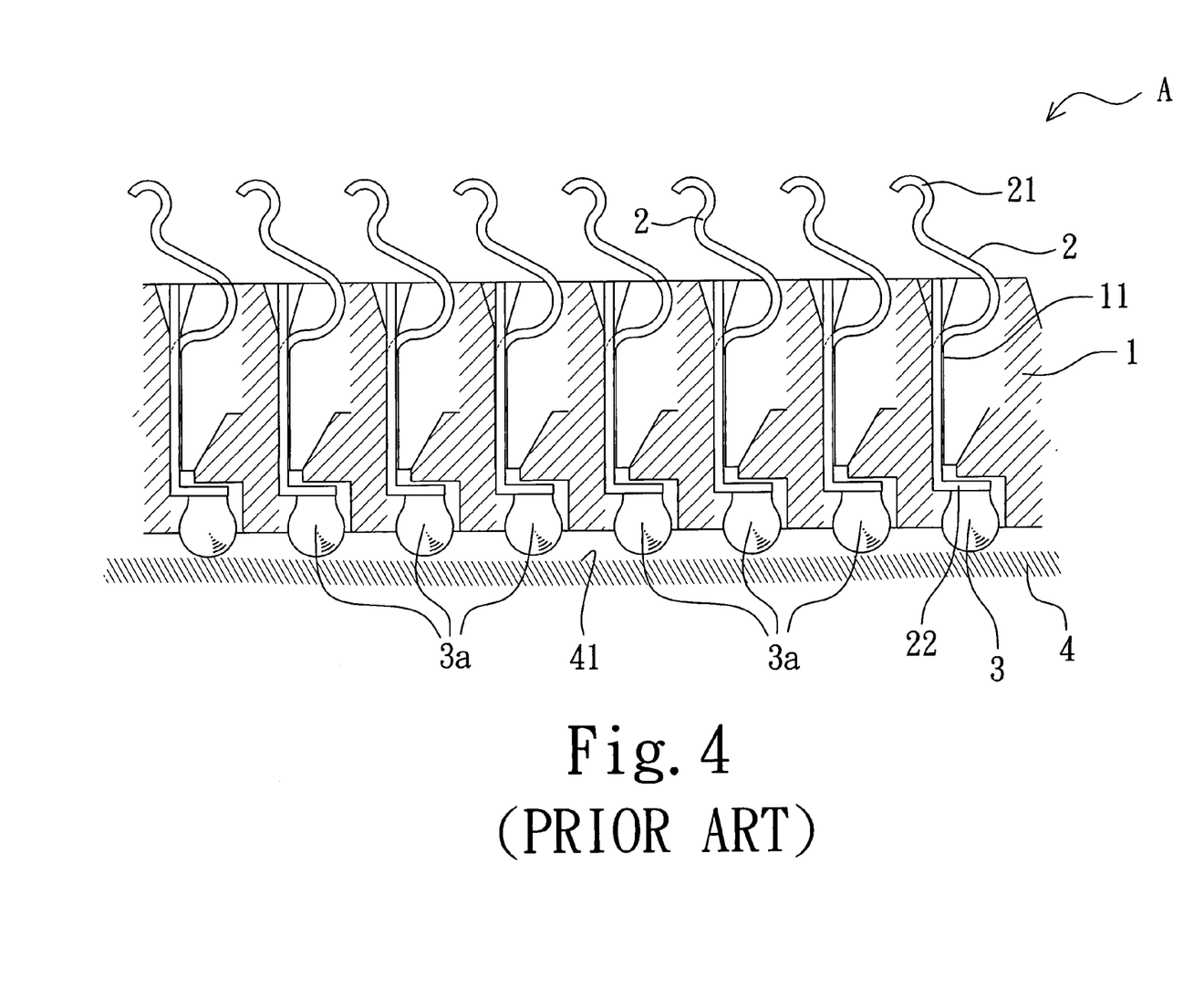
FIG. 4 is a schematic view showing solder balls being pre-soldered to terminals of the socket of FIG. 1.

FIG. 1 shows a top plan view of a socket. FIG. 2 is a schematic view showing solder balls being planted at terminals of the socket of FIG. 1. FIG. 3 is a bottom plan view of a part of FIG. 2. FIG. 4 is a schematic view showing solder balls being pre-soldered to terminals of the socket of FIG. 1.

Referring to FIGS. 1~4, a conventional socket A (with pre-soldered solder balls or planted solder balls) includes a dielectric housing 1, a plurality of terminals 2 and a plurality of solder balls 3.

As shown in FIGS. 2 and 3, as to the socket with planted solder balls, the plurality of terminal passages 11 is perpendicularly defined in the dielectric housing 1. A receiving cavity 12 is defined at the bottom of each terminal passage 11 for receiving the solder ball 3. The terminals 2 are respectively received in the terminal passages 11. Each terminal 2 has a contact portion 21 at the upper end thereof and a solder joint 22 at the lower end thereof. The contact portion 21 is resiliently and electrically connected with a corresponding contact of an electronic module (not shown). The solder joint 22 downwardly extends and locates at a side wall of the receiving cavity 12. The plurality of solder balls 3 is respectively buried between the receiving cavities 12 and the solder joints 22. Each solder joint 22 and each solder ball 3 are secured in the receiving cavity through height and pressing force of a plurality of pressing walls 13 formed by the four side walls of each cavity 12 and an abutment of the bottom wall 14 of each receiving cavity 12, for soldering to a circuit board 4.

To prevent it from falling out, the planted solder ball 3 must be pressed to fix between the receiving cavity and the solder joint 22 of the terminal 2. That is, the solder ball is buried and pressed between the solder joint 22 and the four pressing walls 131, 132, 133, 134 of the receiving cavity 12.

Referring to FIG. 4, as to a socket with pre-soldered solder balls, the basic structure is similar to that of the socket with planted solder balls, except that the bottom end of the solder joint 22 of each terminal 2 is pre-soldered with a solder ball 3 for fixing the solder ball 3 at the solder joint 22 of the terminal 2.

When the solder ball 3 is disposed at the conventional solder joint 22 of the terminal 2 through planting or pre-soldering, the solder ball 3 is fixed at the solder joint 22. That is the position of the solder ball 3 cannot be adjusted up and down, and thus all the solder balls are kept at the same height such that the solder balls can fully make contact with a perfectly flat circuit board 4.

However, the surface of the circuit board 4 is not often precisely flat; sometimes the surface of the circuit board is slightly warped or deformed due to temperature or load. Consequently, the warped or deformed surface of the circuit board 4 cannot fully contact the solder balls 3. For example, when a gap is formed between a concave surface 41 of the circuit board 4 and each solder ball 3a, the solder balls 3a cannot contact the surface of the circuit board 4 during soldering, which results in open solder joints.

Therefore, it is desired to ensure that each solder ball fully contacts the circuit board.

SUMMARY OF THE INVENTION

The object of the present invention is to provide a socket having a structure for grasping solder balls that enables the solder balls to properly move up and down in accordance with flatness or warpage of a surface of a circuit board, thereby ensuring that all the solder balls can fully contact the surface of the circuit board.

To achieve the above object, the present invention provides a socket having a structure for grasping solder balls. The structure is respectively disposed at a plurality of terminals of the socket for soldering with a circuit board. The terminals are respectively received in a plurality of terminal passages defined in a dielectric housing. Each terminal has a solder joint at the lower end thereof, projecting from the bottom of the terminal passage. A grasping hole is laterally defined in the solder joint of each terminal, and a stop wall is formed at the dielectric housing spaced from the grasping hole at a proper distance. The solder ball is secured between the stop wall and the solder joint with a portion of the solder ball being received in the grasping hole. The dimension of the grasping hole is slightly larger than that of a side surface of the solder ball received in the grasping hole, whereby the solder ball is freely movable up and down in the grasping hole of the solder joint. Therefore, when the socket is soldered to the circuit board, the solder balls can adjust through moving up and down in accordance with height of a contacting surface of the circuit board, whereby the solder balls can automatically fully contact the surface of the circuit board, thereby achieving a best soldering effect.

A guiding gap is defined between the dielectric housing and each solder joint and opposite the stop wall, thereby providing the solder joint with a flexible space for resiliently guiding the solder ball into the grasping hole of the solder joint.

The solder joint is formed with a protrusion adjacent to the bottom edge thereof for increasing the depth of the grasping hole grasping the solder ball.

These and other embodiments, aspects and features of the invention will be better understood from a detailed description of the preferred embodiments of the invention, which are further described below in conjunction with the accompanying figures.

DETAILED DESCRIPTION OF THE PREFERRED EMBODIMENT

Figure 5:
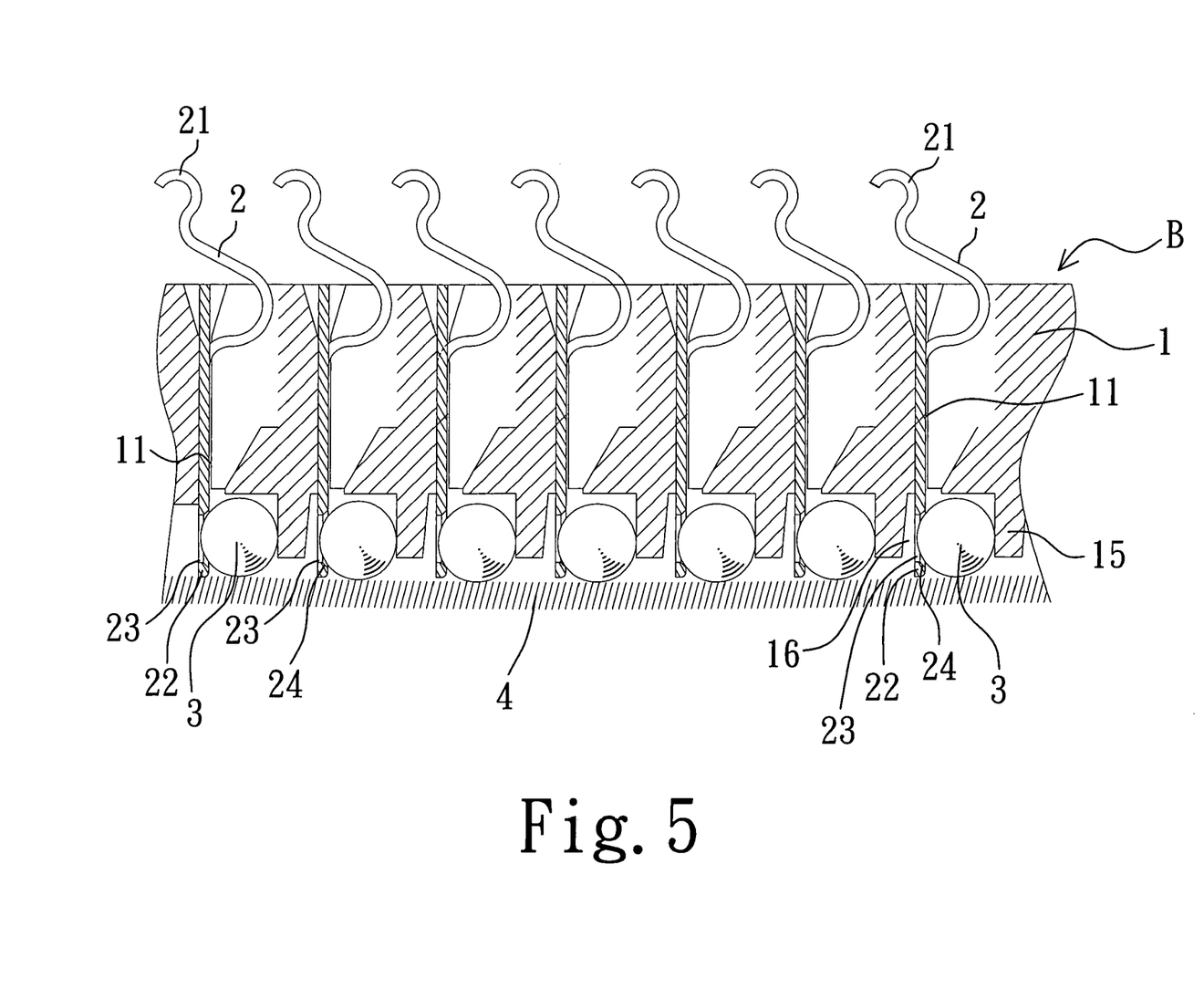
FIG. 5 shows a cross-sectional view of a socket having a structure for grasping solder balls in accordance with an embodiment of the present invention.
Figure 6:
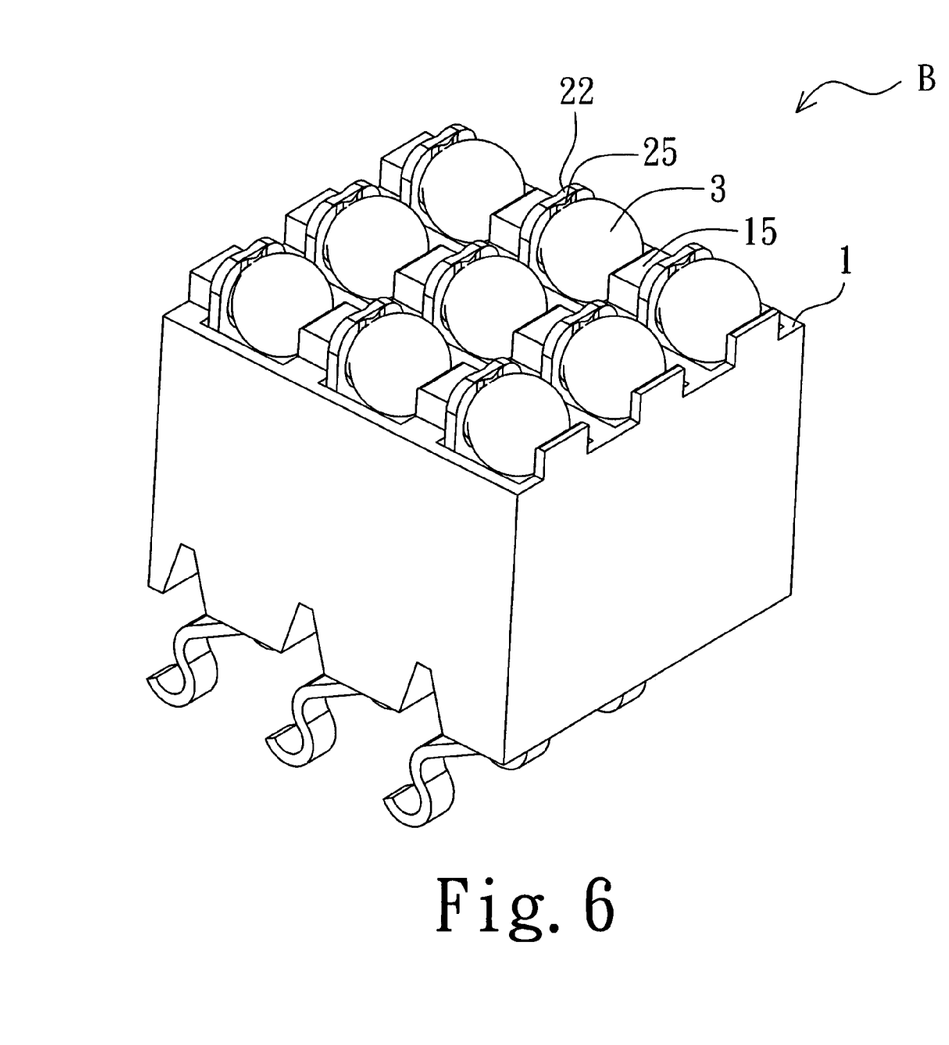
FIG. 6 is a perspective view of a part of FIG. 5 viewed from bottom.
Figure 7:
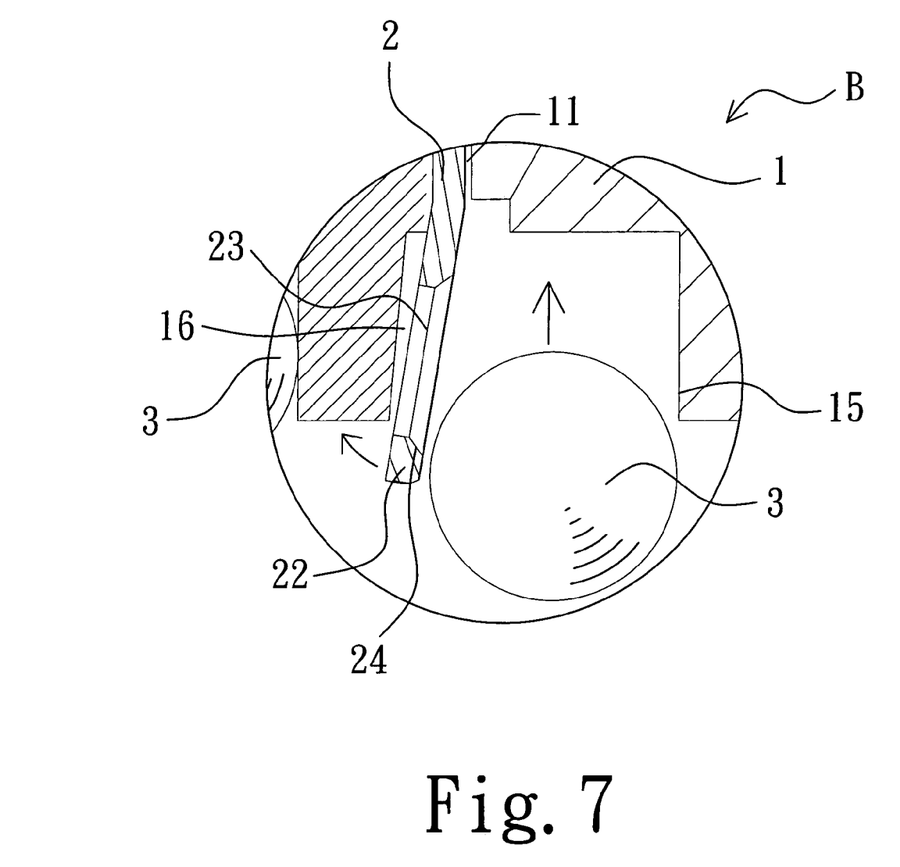
FIG. 7 is an enlarged view of a part of FIG. 5, showing a solder joint of a terminal being resiliently deformed to guide a solder ball.
Figure 8:
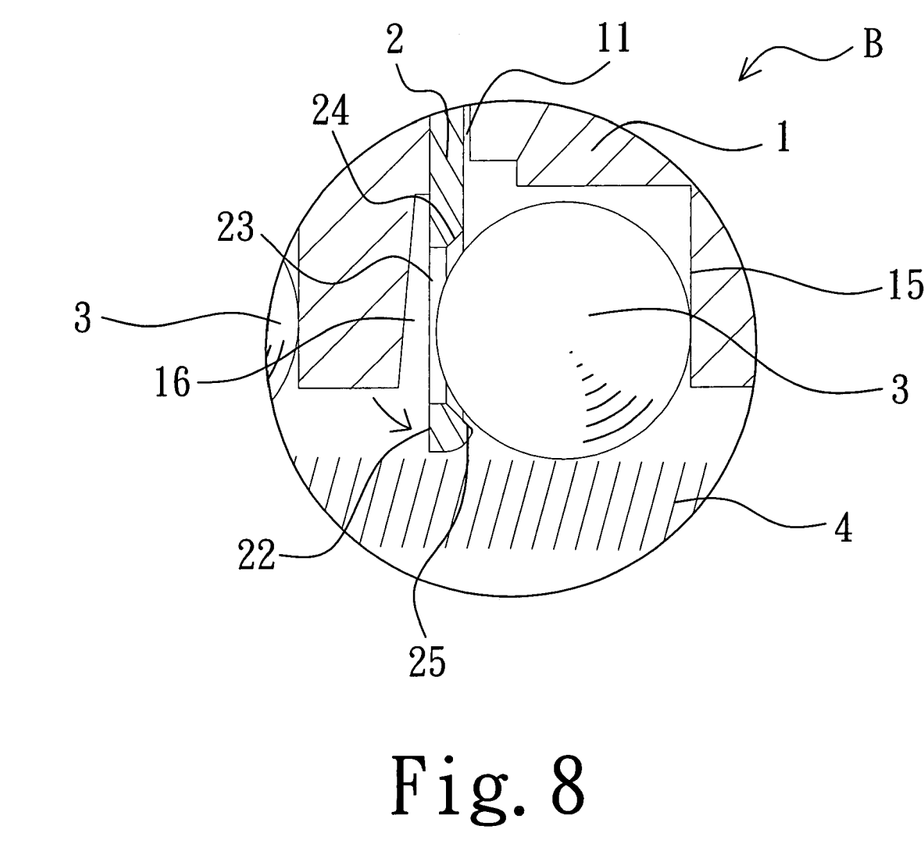
FIG. 8 is similar to FIG. 7 but showing the solder joint of the terminal recovering to grasp the solder ball in a grasping hole thereof.
Figure 9:
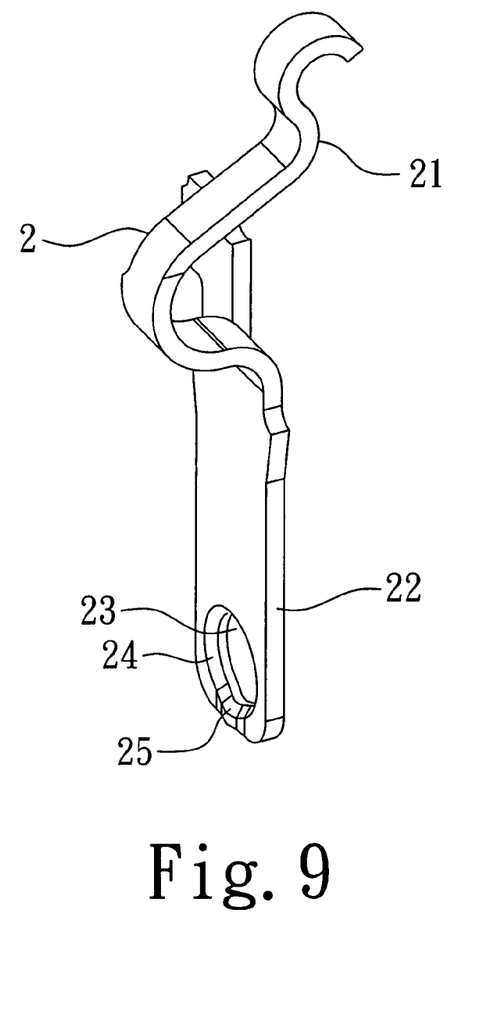
FIG. 9 is a perspective view of the terminal of FIG. 8.

Referring to FIGS. 5~9, FIG. 5 shows a cross-sectional view of a socket having a structure for grasping solder balls in accordance with an embodiment of the present invention. FIG. 6 is a perspective view of a part of FIG. 5 viewed from bottom. FIG. 7 is an enlarged view of a part of FIG. 5, showing a solder joint of a terminal being resiliently deformed to guide a solder ball. FIG. 8 is similar to FIG. 7 but showing the solder joint of the terminal recovering to grasp the solder ball in a grasping hole thereof. FIG. 9 is a perspective view of the terminal of FIG. 8.

As shown in FIGS. 5~9, the socket B of the present invention includes a dielectric housing 1, a plurality of terminals 2 and a plurality of solder balls 3.

The dielectric housing 1 is defined with a plurality of terminal passages 11 in a vertical direction thereof. The terminals 2 are respectively received in the terminal passages 11. Each terminal 2 is formed with a contact portion 21 at the upper end thereof and a solder joint 22 at the lower end thereof. The contact portion 21 is resiliently and electrically connected with a corresponding contact of an electronic module (not shown). The solder joint 22 downwardly extends and projects from the bottom of the terminal passage 11. Each of the solder balls 3 is spherical and is respectively disposed between the dielectric housing 1 and each solder joint 22 for soldering with a circuit board 4.

The socket having a structure for grasping solder balls mainly includes a grasping hole 23 laterally defined in the solder joint 22 of each terminal 2 near the free end of the solder joint 22, and a stop wall 15 formed at the dielectric housing 1 spaced from the grasping hole 23 at a proper distance. The grasping hole 23 is an open taper hole with a tapered inner edge thereof for accommodating the solder ball 3. The dimension of the grasping hole 23 is slightly larger than that of a side surface of the solder ball received in the grasping hole 23, whereby the solder ball 3 is movably grasped in the grasping hole 23 of the solder joint 22. Therefore, the solder ball 3 is secured between the stop wall 15 and the solder joint 22 with a portion of the solder ball 3 being received in the grasping hole 23. Since the dimension of the grasping hole 23 is slightly larger than that of the side surface of the solder ball received in the grasping hole 23, the solder ball 3 is freely movable up and down in the grasping hole 23 of the solder joint 22.

Though this embodiment illustrates the grasping hole 23 as a circular tapered hole, the present invention is not intended to limit shape of the grasping hole 23. For example, the grasping hole may be an elliptic tapered hole, a square tapered hole, or a polygonal tapered hole, such as a hexagonal tapered hole or an octagonal tapered hole. The grasping hole 23 may be of any shape as long as the solder ball can be secured in the grasping hole 23 and moved up and down in the grasping hole 23.

Since the solder ball 3 is movable up and down, when the socket B is soldered with the circuit board 4, the solder balls can adjust through moving up and down in accordance with height of a contacting surface of the circuit board, whereby the solder balls can automatically fully contact with the surface of the circuit board. Thus, the terminals 2 and the circuit board 4 are soldered with a best soldering effect.

Furthermore, since the solder balls 3 of the present invention are secured between the grasping hole 23 of the solder joint 22 of each terminal 2 and the stop wall 15, thereby movably grasping opposite sides of the solder ball 3, but not secured with four surfaces as mentioned in the prior art, the other opposite sides of the solder ball 3 are not shielded. Therefore, when the circuit board 4 is soldered through surface mount technology (SMT), high temperature heated air is ready to flow to the solder balls 3 thereby enhancing the soldering effect.

Moreover, a protrusion 25 is further formed at the bottom edge of the grasping hole 23 of the solder joint 22 of the terminal 2 for enhancing the grasping hole 23 to grasp the solder ball 3.

In addition, a guiding gap 16 is defined between the dielectric housing 1 and each solder joint 22 and opposite the stop wall 15, thereby providing the solder joint 22 with a flexible space for resiliently guiding the solder ball 3 into the grasping hole 23 of the solder joint 22. That is, when the solder ball 3 is assembled from the bottom of the dielectric housing 1, the solder joint is allowed to resiliently move toward the guiding gap 16 (as shown in FIG. 6), and when the solder ball 3 is moved through the bottom of the solder joint 22 and into the grasping hole 23, the solder joint recovers and cooperates with the stop wall 15 to grasp the solder ball 3.

Figure 10:
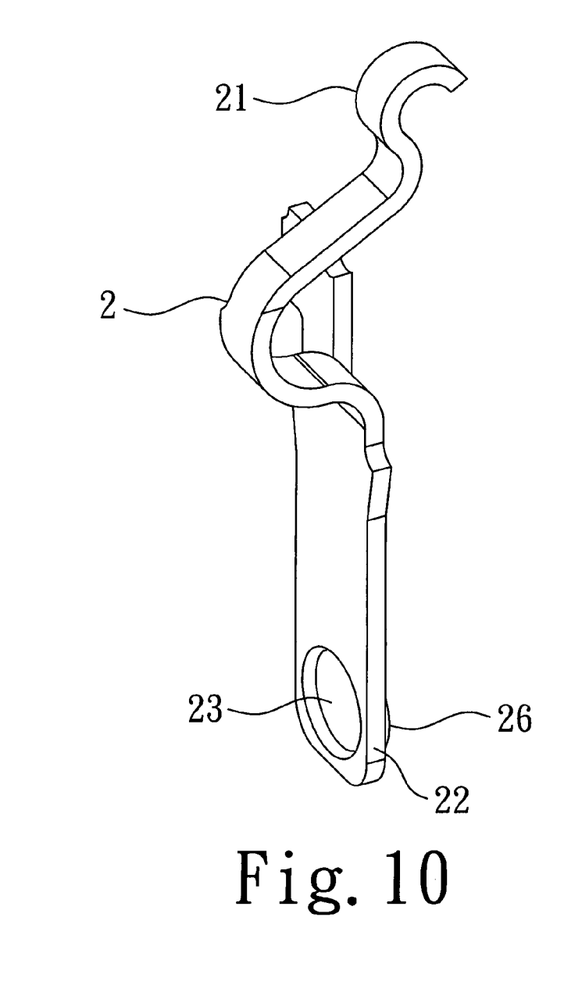
FIG. 10 is a perspective view of a terminal of a socket having a structure for grasping solder balls in accordance with another embodiment of the present invention.
Figure 11:
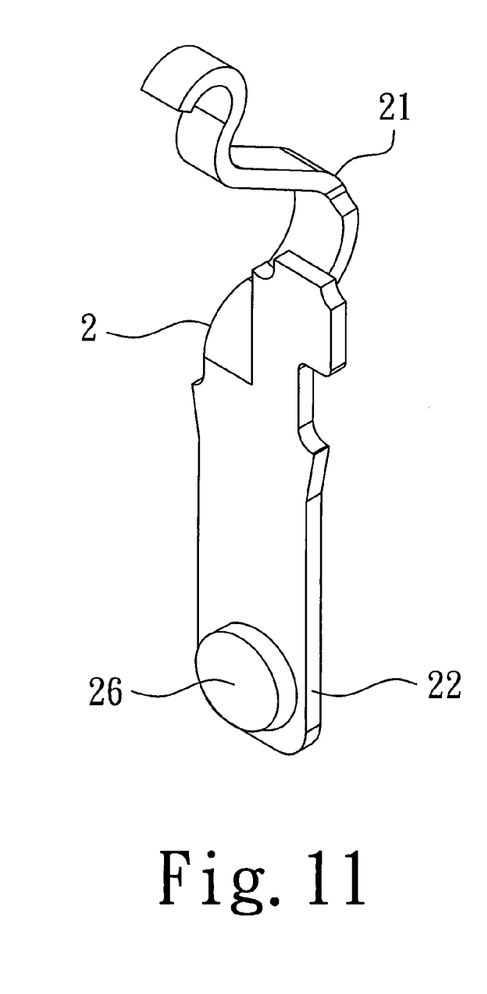
FIG. 11 is similar to FIG. 10 but viewed from another angle.

FIG. 10 is a perspective view of a terminal of a socket having a structure for grasping solder balls in accordance with another embodiment of the present invention. FIG. 11 is similar to FIG. 10 but viewed from another angle. The grasping hole 23 shown in FIGS. 5~9 laterally extends through the solder joint of the terminal. Referring to FIGS. 10 and 11, the grasping hole 23 does not extend through the solder joint 22 but maintains in a tapered shape. That is the grasping hole 23 has a recessed portion 26. For example, the grasping hole has a semispherical recessed portion and the edge of the grasping hole is tapered, thereby having a function of movably grasping the solder ball 3.

The preferred embodiments, aspects, and features of the invention have been described in detail. It will be apparent to those skilled in the art that numerous variations, modifications, and substitutions may be made without departing from the spirit of the invention as disclosed and further claimed below.

What is claimed is:

1. A socket having a structure for grasping solder balls for soldering with a circuit board, the socket comprising:

a dielectric housing with a plurality of terminal passages being defined therethrough in a vertical direction thereof;

a plurality of terminals respectively received in the terminal passages, each terminal being formed with a contact portion at the upper end thereof and a solder joint at the lower end thereof, each solder joint projecting from the bottom of each terminal passage; and a plurality of solder balls being spherical and respectively disposed between the solder joint of each terminal and a stop wall of the dielectric housing; wherein:

a grasping hole is laterally defined in the solder joint of each terminal, the stop wall is formed at the dielectric housing spaced from the grasping hole at a proper distance, the grasping hole is an open tapered hole with a tapered inner edge thereof for accommodating the solder ball, the dimension of the grasping hole is slightly larger than that of a side surface of the solder ball received in the grasping hole, whereby the solder ball is movably grasped in the grasping hole of the solder joint, the solder ball is secured between the stop wall and the solder joint with a portion of the solder ball being received in the grasping hole, the solder ball is freely movable up and down in the grasping hole of the solder joint, whereby when the socket is soldered with the circuit board, the solder balls can adjust through moving up and down in accordance with a height of a contacting surface of the circuit board such that the solder balls can automatically fully contact the surface of the circuit board to achieve a best soldering effect.

2. The socket having a structure for grasping solder balls of claim 1, wherein the grasping hole extends through the solder joint.

3. The socket having a structure for grasping solder balls of claim 1, wherein the grasping hole does not extend through the solder joint but has a recessed portion.

4. The socket having a structure for grasping solder balls of claim 3, wherein the grasping hole has a semispherical recessed portion.

5. The socket having a structure for grasping solder balls of claim 1, wherein the solder joint is formed with a protrusion adjacent to the bottom edge thereof.

6. The socket having a structure for grasping solder balls of claim 1, wherein a guiding gap is defined between the dielectric housing and each solder joint and opposite the stop wall, thereby providing the solder joint with a flexible space for resiliently guiding the solder ball into the grasping hole of the solder joint.

7. The socket having a structure for grasping solder balls of claim 1, wherein the grasping hole is tapered.

* * * * *